April 25, 1961 H. SCHARLA-NIELSEN ET AL 2,981,896
RADIO FREQUENCY AMPLIFIER
Original Filed Sept. 12, 1957
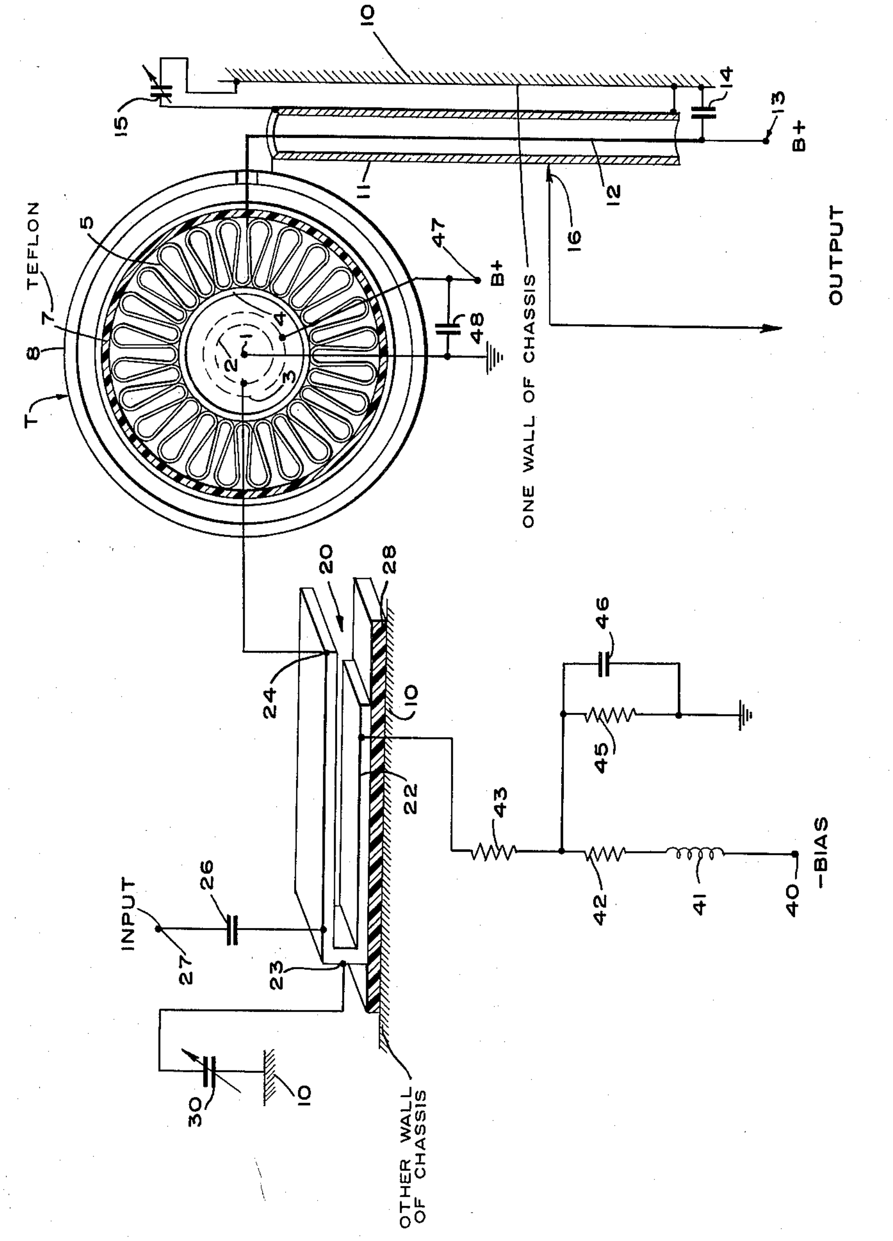
INVENTORS
HANS SCHARLA-NIELSEN
FLOYD DONALD J. McLAMB &
DANIEL D. McRAE
BY Hurvitz & Rose
ATTORNEYS United States Patent Office 2,981,896

Patented Apr. 25, 1961

2,981,896

RADIO FREQUENCY AMPLIFIER

Hans Scharla-Nielsen, Indialantic, and Daniel D. McRae and Floyd Donald J. McLamb, Melbourne, Fla., assignors to Radiation, Inc., Melbourne, Fla., a corporation of Florida Original application Sept. 12, 1957, Ser. No. 683,574, now Patent No. 2,925,477, dated Feb. 16, 1960. Divided and this application Apr. 1, 1959, Ser. No. 808,351

7 Claims. (Cl. 330—53)

This application is a division of our application Serial No. 683,574, filed September 12, 1957, now Patent No. 2,925,477, granted February 16, 1960.

The present invention relates generally to vacuum tube amplifiers, and particularly to ultra-high frequency amplifiers having novel input and output tank configurations and coupling elements.

A variety of amplifiers are known to the prior art which are capable of operating in the U.H.F. region, and specifically in the vicinity of 200 mc. In general, such amplifiers have been relatively bulky devices, of low efficiency, incapable of operation over a wide variety of environmental conditions, having relatively small output power, and small power gain.

It is a broad object of the present invention to provide a novel amplifier, tunable over a range of frequencies in the U.H.F. band, capable of operation from a driver of convenient impedance, and of relatively low power and voltage output, which shall have high power gain and efficiency, be small, ruggedized, and capable of operation under severe environmental conditions.

In one specific embodiment of an amplifier according to the present invention, 50 watts of output power is delivered by a single tube to a 50 ohm load, when driven from a two watt, 50 ohm, R.F. oscillator or transmitter. The amplifier is readily tunable over a frequency range 215 to 245 mc.

The tube type employed is a 4CX300A Eimac stacked-ceramic tetrode, which possesses the required environmental qualifications, but has the defect that tube and socket have on input capacitance of 40 $\mu\mu$f. To operate efficiently, Class C operation is employed, but total driving signal available is 10 v. R.M.S., i.e., 2 watts out of a 50 ohm driver. Since far more than 10 v. of driving signal is required for Class C operation, it is necessary to employ voltage step up in the input circuit. It is one feature of the present invention to provide a system for driving a high efficiency amplifier tube having relatively high input capacitance, at high level, from a low level signal source.

A further problem encountered in the pertinent art is to design an output tank for an amplifier with a sufficiently high Q to realize a high power gain, of the order of 25, which is yet capable of efficiently coupling about 50 watts of power to a 50 ohm load, the circuitry to be rugged and to be tunable over the desired frequency range. It is a further feature of the invention to provide the required output circuitry and construction.

An input tank circuit according to the present invention consists of two transmission lines, arranged so that their series combination as seen from the grid of the amplifier tube is the conjugate of the input impedance of the tube, so that the circuit resonates. One of the transmission lines is open at the grid end and shorted at the remaining end, and is driven at a point adjacent the shorted end. The other transmission line is formed of one conductor of the one line, taken with the chassis of the amplifier.

The one line is shorter than $n/4\lambda$, where $\lambda$ is wave length and $n$ is odd, and hence appears as an inductance. The other line length is selected to appear as a capacitance between one side of the one line and the chassis. Across this capacitance is connected a variable trimmer condenser. The values of capacity and inductance are selected to resonate with the tube input capicity, and the tapping point for the one line is so selected that voltage step-up occurs.

Structurally, the input tank may consist of a U-shaped metallic device, having one longer leg and one shorter leg. The base of the U provides a short at the cold end of the tank circuit, and the open end of the long leg is connected to the grid of the amplifier. The short leg is extended parallel to and is spaced from the chassis by a strip of insulation. The structure is rigid by virtue of the intimate relation between the short leg and the chassis, and may be rugged by virtue of fabrication from a solid block of metal, in which a longitudinal slot is milled.

Since the bar may be bolted solidly to the chassis while remaining electrically or conductively isolated therefrom, the structure is well suited to withstand shock and vibration, while the capacity of the bar to chassis forms a capacity which assists in tuning the input tank.

The major impedance determining element of the tank, i.e., the line formed by the long and short legs, may be made to have a very high Q, since the bar has extremely low resistance. The loading effects of the tuning capacitor and the grid bias circuitry appear across the lower line, i.e., the line formed by the shorter leg and the chassis, and hence do not affect the Q, and therefore the voltage step-up of the main or upper line.

The output tank circuit is a tuned transmission line, consisting of a metallic tube, extending parallel with the chassis of the system and a short distance therefrom, so as to form therewith a capacitively loaded ¼ wave line. The chassis is more extensive or of greater length in the direction of the transmission line, than is the transmission line itself. The tube is coupled to the amplifier tube by means of a capacitor, which consists of a Teflon strip or sheet wrapped around the anode radiator of the tube, and of a metallic clamp wrapped around the Teflon strip or sheet.

The anode supply line may consist of a lead extending interiorly of the output tank tube. Thereby the lead and tube constitute an effective choke for R.F. R.F. choke action occurs in the sense that the anode sees a high impedance in looking back into the lead and tube, because the electrical length of the lead and tube considered as a transmission line is approximately one quarter wave length at the operating frequency and because the line is shorted for R.F. at the end remote from the anode. Since the output tank tube may be at D.C. ground potential, output power may be derived by a tap to the tube at a point selected to provide suitable output impedance. The output tank tube may be shunted by a variable tuning capacitor, connected between the anode coupling capacitor and the chassis. This tuning capacitor is not subjected to D.C. voltage, and hence need have only sufficient rating to withstand the R.F. voltage to the output tank.

It is, accordingly, a broad object of the present invention to provide a novel radio frequency amplifier, having high power gain and high efficiency, of convenient input impedance, and capable of driving an output load of convenient impedance.

It is a further object of the invention to provide a novel vacuum tube amplifier having a tuned transmission line input tank and a tuned transmission line output tank, the input tank resonating with the input capacity of the vacuum tube and the output tank being employed to provide R.F. power at zero D.C. level, and as an isolating element for a D.C. plate power lead.

Still another object of the invention resides in the provision of a novel input tank circuit for an amplifier, capable of withstanding shock and vibration, and including a high Q element and a capacitive element in a unitary structure.

It is still another object of the invention to provide an output tank circuit, having a novel coupling arrangement to a vacuum tube anode, and provision for supplying D.C. voltage to the anode, the tank circuit including a metallic tube within which extends a D.C. power lead, said lead being bypassed at both ends to said tube such that it represents an R.F. choke to shunt feed D.C. to the vacuum tube anode.

The above and still further objects, features and advantages of the present invention will become apparent upon consideration of the following detailed description of one specific embodiment thereof, especially when taken in conjunction with the accompanying drawings, wherein:

The single figure of the drawings is a representation, partly schematic and partly structural of an amplifier according to the present invention.

Referring now more particularly to the accompanying drawings, the reference letter T denotes a tetrode vacuum tube, preferably of the 4CX300A Eimac stacked-ceramic type, although other tube types may be employed within the scope of the invention. The tetrode T includes a cathode 1, a control grid 2, a screen grid 3 and anode 4 and a heat radiator 5, which is of metallic structure and is secured electrically and physically at multiple points about the anode 5, the anode and the radiator being cylindrical in shape.

Surrounding the radiator 5 is a layer 7 of Teflon or the like, which constitutes a suitable low loss insulating medium for a clamp 8, in the form of a ring surrounding the radiator 5 and insulated therefrom for D.C. The radiator 5, the layer of Teflon or the like 7, and the clamp 8 form a capacitor for coupling an external tank circuit to the anode 4.

The numeral 10 denotes the chassis of an amplifier structure. Extending adjacent and parallel thereto is a metallic tube 11, the length of which, in relation to its spacing from chassis 10 established a parallel resonant circuit, in the form of a capacitively loaded quarter wave transmission line shorted at one end. The chassis is greater in length than the transmission line itself, as is usual for a chassis and as is obvious from the drawings.

An anode power lead 12 extends internally of the tube 11, from a power terminal 13 to anode 5, in insulated relation to the tube 11. The latter is connected at one end to the clamp 8, by a short lead L, and is thereby capacitively coupled to the anode 4. The terminal 13 may be by-passed to ground for R.F. by a fixed condenser 14, and the tube 11 may be shunted to ground by a variable tuning capacitor 15, which serves to vary the resonant frequency of the output tank circuit over a small range of values.

Since the tube 11 is D.C. isolated from the anode, the tuning capacitor 15 need only be designed for withstanding R.F. voltage, and not R.F. superposed on D.C. The lead 12 in conjunction with the tube 11 provide a concentric line R.F. shorted at both ends.

Output power referenced to the chassis potential may be derived from the outside of tube 11, by means of a tap 16, and a conductive lead, since tube 11 is D.C. connected to the chassis. Moreover, the tap point may be selected to provide an impedance match to a 50 ohm or other desired load, since the tube 11 and the tap 16 act as an impedance step-down transformer, while the tube itself is seen from the tube anode as a high impedance equivalent to a parallel resonant circuit.

The tube 11 may be bent into semi-circular, or circular form, or otherwise as desired, to conserve space.

The input tank circuit consists of a U-shaped bar 20, which may be machined from a solid block of metal. The U-shaped bar 20 includes a relatively long leg 21, a relatively short leg 22 extending parallel to the long leg 21, and a base 23 joining the legs at an end. The bar then constitutes a parallel conductor transmission line open at one end, and shorted by the base 23 at the other end.

The open end 24 of the long leg 21 is directly connected to the grid 2, while a point 25 of the long leg 21, adjacent to but not at the base 23, is coupled by a capacitor 26 to a signal input terminal 27.

The short leg 22 is firmly secured to the chassis 10 mechanically, extending parallel thereto, but is electrically insulated therefrom by a layer 28 of Teflon, or other low loss insulating material. The lower leg 22 taken with the chassis provides then, a capacity, by virtue of its length and its spacing from the chassis. Present is both fixed capacity and capacity by virtue of transmission line properties of the leg and chassis. Moreover, a tunable capacity 30 isc onnected between base 23 and chassis 10, to premit variation of the effective capacity of the short leg to chassis circuit.

The input circuit of the vacuum tube possesses inherent capacity. For the preferred tube type this value is about 40$\mu\mu$f. The overall lengths of the input tank lines, i.e., legs 21 and 22, and their spacings and characteristic impedances, are selected to resonate with the tube input capacity, the leg 21 being for this purpose shorter than ¼$\lambda$, where $\lambda$ is the operating wave length, and hence appearing as an effective inductance.

The transmission line 20 represents an extremely high Q circuit, because fabricated of thick low resistivity metal, and because lacking in loading of any type. It follows that a tremendous gain in R.F. voltage appears, as between tap 25 and grid 2. It has been found, in practice, that two watts can be supplied from a 50 ohm source, at terminal 27, and that this power is sufficient to develop adequate R.F. driving voltage at the grid of the amplifier despite the fact that the amplifier is operating Class C, or nearly Class C, in order to obtain high efficiency of power conversion on the output circuit. In effect the control grid of the tetrode 1 sees an impedance conjugate to its own impedance, when looking into the line 20, and hence forms part of a series resonant network, which permits high R.F. driving current to flow. At the same time the input terminal 27 sees 50 ohms by virtue of the tap point 25, and the line 20 provides a high voltage at the grid because it is open at the grid end and is a high Q line. An impedance match exists both between the driving source and the tank circuit, and between the tank circuit and the tube input circuit, accordingly, accompanied by a voltage step-up at the tube input circuit. Fixed bias for the control grid is provided from a negative voltage terminal 40, which is connected via choke 41, and two series connected resistances 42, 43 to the base 23. In addition, a parallel resistance 45 and condenser 46 is connected from the junction of resistance 42, 43 to ground. The latter element provides grid-leak bias, and is suitably designed for that purpose. The fixed bias may be removed when the amplifier is in operation, but is required while anode and screen voltages are applied without concurrent application of R.F. drive voltage.

The screen grid 3 is connected directly to a B+ voltage terminal 47, and is by-passed to ground by a condenser 48, which in a preferred embodiment of the invention may be built into the socket of the tube 1.

The two transmission line tank circuits, i.e., the input tank and the output tank, may be physically located on opposite sides of a chassis wall, to reduce coupling therebetween.

While the system of the invention has been disclosed as an amplifier, the structure and circuitry are equally adapted to utilization as an oscillator, by coupling the output lead to the input lead in proper phase, and may be employed as a modulated amplifier, as by varying the anode voltage in response to a signal.

While we have described and illustrated one specific embodiment of our invention, it will be clear that variations of the details of construction which are specifically illustrated and described may be resorted to without departing from the true spirit and scope of the invention as defined in the appended claims.

What is claimed is:

1. In combination, a tank circuit for a power amplifying element biased for class C operation and operative at a frequency $f$ and a corresponding wave length $\lambda$, said tank circuit comprising an inductance of value L and a capacitance of value C connected in shunt to said inductance, where $f$ equals $\frac{1}{2\pi\sqrt{LC}}$, said capacitance being lumped, said inductance including a two ended hollow tubular conductor open at both ends, a chassis comprising an extensive flat metallic plate, said tubular conductor being spaced from said metallic plate over its entire length, said tubular conductor having a length approximately $\lambda/4$ and said plate having a length substantially greater than $\lambda/4$ in a direction parallel to said tubular conductor, only a single lead extending in insulated relation entirely through said tubular conductor and extending from both open ends, a by-pass capacitor for frequency $f$ coupling said lead at only that one of its ends immediately adjacent said tubular conductor to said metallic plate said tubular conductor and said single lead being an effective choke at said frequency $f$, a direct current connection of negligible impedance short circuiting the one end of said tubular conductor corresponding with the one end of said lead to said metallic plate, said capacitance having said value C coupling the other end of said tubular conductor to said metallic plate, said amplifying element having an output electrode, the other end of said lead being connected for direct current directly to said output electrode and serving as a direct current power lead for said output electrode, and a two electrode coupling condenser coupling the other end of said tubular conductor to said output electrode, said output electrode being surrounded by one electrode of said coupling condenser and directly connected thereto at at least multiple points, the second electrode of said coupling condenser surrounding the one electrode and being insulated therefrom.

2. The combination according to claim 1 wherein said amplifying element includes a cathode, means directly connecting said cathode to a ground point, a resonant drive circuit for said amplifying element, said tank circuit being located on one side of said metallic plate, said resonant drive circuit being mounted on the other side of said metallic plate and consisting of open unshielded parallel lines.

3. The combination according to claim 2 wherein said resonant drive circuit comprises a two conductor radio frequency transmission line of which the other side of said metallic plate is one conductor.

4. In a vacuum tube high efficiency power amplifier circuit arranged to amplify signals of wave length $\lambda$, a vacuum tube having an anode and a control grid, a single flat metallic sheet having two sides, a metallic tube having two open ends, said metallic tube being spaced along its entire length from one side of said metallic sheet, said metallic tube having a length of approximately $$\frac{\lambda}{4}$$

and a spacing along its entire length from one side of said metallic sheet selected to establish a two conductor transmission line having inductive reactance at said wave length $\lambda$, said metallic sheet having a length substantially greater than the length of said metallic tube in the direction of the latter, said transmission line consisting of the exterior of said metallic tube as one conductor and said one side of said metallic sheet as the other conductor of said two conductor transmission line, a two plate condenser connected between one end of said metallic tube and said anode, a D.C. lead connected at one end to said anode for supplying anode voltage to said anode, said D.C. lead extending only parallel to the axis of said metallic tube interiorly of said metallic tube and through the open ends thereof and in insulated relation thereto, means capacitively coupling said D.C. lead to said metallic tube and to said metallic sheet at the other end of said metallic tube to provide an effective R.F. choke as seen from said anode, said effective R.F. choke comprising said lead and the interior wall of said metallic tube, a tuning capacitance connected between said one end of said metallic tube and said metallic sheet, said tuning capacitance parallel resonating with said resonant transmission line at said wave length $\lambda$, means for providing signal of wave length $\lambda$ to said control grid, and an output lead connected to an exterior point of said metallic tube, wherein said vacuum tube includes a cathode directly connected via a path of negligible impedance to a ground point, said vacuum tube and said metallic tube being located on the same side of said metallic sheet, said means for providing signal of wave length $\lambda$ to said control grid being a resonant drive circuit for said control grid, said resonant drive circuit including a transmission line, said transmission line including the opposite side of said metallic sheet as a transmission line element of said transmission line, said anode being cylindrical, said two plate condenser connected between one end of said metallic tube and said anode including a metallic cylinder surrounding said anode and connected to said one end of said metallic tube and an insulating cylindrical spacer extending between said metallic cylinder and said anode.

5. In combination, a power amplifier operative in class C mode at a wave length $\lambda$, including a vacuum tube having an anode, a two conductor transmission line having an effective length approximately $$\frac{n\lambda}{4}$$

where $n$ is an odd integer, such that said transmission line is an inductance at said wave length $\lambda$, said transmission line including as one of its conductors a hollow metallic tube open at both ends and of length approximately $$\frac{n\lambda}{4}$$

only a single lead extending internally of said metallic conductor and therethrough and insulated therefrom along its entire length, said lead being connected for direct current only to said anode at one end and to a B terminal at the other end, means independent of said lead solely capacitively coupling one end of said hollow metallic tube to said anode, means shorting said two conductor transmission line at its other end for D.C., means shorting said other end of said lead to the other conductor of said two conductor transmission line only for alternating current to provide an effective radio frequency choke as seen from said anode for said wave length $\lambda$, and a tuning capacitor parallel resonating with said inductance at said wave length $\lambda$, wherein the other conductor of said transmission line is one extensive ground plate consisting of one wall of a chassis.

6. The combination according to claim 5 wherein said anode is cylindrical and wherein said means for solely capacitively coupling one end of said hollow metallic tube to said anode includes a metallic cylinder surrounding said anode and insulated therefrom.

7. In a power amplifier for operation in class C mode at an ultra high frequency $f$, a vacuum tube biased for class C operation and having an anode, said anode being cylindrical, a flexible insulating sheet surrounding said anode, and a metallic cylindrical clamp surrounding and clamping said sheet and insulated from said anode by said sheet, an extended untuned metallic chassis, a hollow metallic tube having a first open end and a second open end and a length of approximately $$\frac{\lambda}{4}$$

where $\lambda$ is the wave length corresponding with frequency $f$, said hollow metallic tube extending parallel to said chassis but spaced therefrom to form a transmission line therewith, said chassis having a substantially greater length in the direction of said hollow metallic tube, a direct connection from said first end of said hollow metallic tube to said cylindrical clamp, a direct current connection of negligible impedance from said second end of said hollow metallic tube to said chassis, an output tap connected to an external point of said hollow metallic tube intermediate said first and second ends, a tuning condenser connected between said first end of said hollow metallic tube and said metallic chassis, said condenser having a capacitance so related to the inductance of said transmission line as to provide therewith a tank circuit parallel resonant at the frequency $f$, wherein is provided a lead extending completely through said hollow metallic tube, means directly connecting one end of said lead to said anode, means coupling the other end of said lead to said second end of said hollow metallic tube via a connection essentially consisting of condenser of negligible impedance at frequency $f$, and a B terminal connected to said other end of said lead, said hollow metallic tube and said lead constituting an effective choke at said frequency $f$.

References Cited in the file of this patent

UNITED STATES PATENTS

| | | |
|---|---|---|
| 2,068,990 | Kolster et al. | Jan. 26, 1937 |
| 2,132,208 | Dunmore | Oct. 4, 1938 |
| 2,143,671 | Zottu | Jan. 10, 1939 |
| 2,228,126 | Rambo | Jan. 7, 1941 |
| 2,272,062 | George | Feb. 3, 1942 |
| 2,416,827 | George | Mar. 4, 1947 |
| 2,421,784 | Haeseler et al. | June 10, 1947 |
| 2,463,724 | Starner | Mar. 8, 1949 |
| 2,748,286 | Bussard | May 29, 1956 |
| 2,771,516 | Bucksbaum | Nov. 20, 1956 |
| 2,772,355 | Deutsch et al. | Nov. 27, 1956 |
| 2,774,812 | Clark | Dec. 18, 1956 |
| 2,817,719 | Decker | Dec. 24, 1957 |
| 2,834,948 | Pan et al. | May 13, 1958 |

OTHER REFERENCES

Barrett: I.R.E. Transaction on Microwave Theory and Techniques, Vol. MTT-3, No. 2, March 1955, pages 1, 2 and 6.

Arditi: I.R.E. Transactions on Microwave Theory and Techniques, Vol. MTT-3, No. 2, March 1955, pages 31 and 38.